United States Patent [19]
Kuhara et al.

[11] Patent Number: 5,412,229
[45] Date of Patent: May 2, 1995

[54] SEMICONDUCTOR LIGHT DETECTING DEVICE MAKING USE OF A PHOTODIODE CHIP

[75] Inventors: Yoshiki Kuhara; Hideaki Koseki; Hisato Michikoshi; Ichiro Tonai, all of Osaka, Japan

[73] Assignee: Sumitomo Electric Industries, Ltd., Japan

[21] Appl. No.: 159,577

[22] Filed: Dec. 1, 1993

Related U.S. Application Data

[63] Continuation-in-part of Ser. No. 12,477, Feb. 2, 1993, and a continuation-in-part of Ser. No. 50,720, Apr. 8, 1993, which is a continuation of Ser. No. 751,188, Aug. 29, 1991, abandoned.

[30] Foreign Application Priority Data

Aug. 31, 1990 [JP] Japan .................... 2-230206
Feb. 3, 1992 [JP] Japan .................... 4-017606
Feb. 3, 1992 [JP] Japan .................... 4-017620

[51] Int. Cl.6 .................. H01L 27/14; H01L 33/00
[52] U.S. Cl. .................. 257/183; 257/184; 257/200; 257/12; 257/21; 257/431; 257/432; 257/433; 257/436
[58] Field of Search ............... 257/182, 183, 184, 200, 257/12, 21, 431, 432, 433, 436; 372/45

[56] References Cited

U.S. PATENT DOCUMENTS

| | | | |
|---|---|---|---|
| 4,819,039 | 4/1989 | Chi et al. | 357/17 |
| 4,949,144 | 8/1990 | Kuroda et al. | 357/30 |
| 4,999,842 | 3/1991 | Huang et al. | 372/45 |
| 5,068,869 | 11/1991 | Wang et al. | 372/45 |
| 5,153,889 | 10/1992 | Sugawara et al. | 372/45 |

*Primary Examiner*—Viet Q. Nguyen
*Attorney, Agent, or Firm*—Beveridge, DeGrandi, Weilacher & Young

[57] ABSTRACT

A semiconductor light detecting device in which a housing with an optical fiber is inserted in is secured to a header with a photodiode chip mounted on integral therewith, and a light detecting surface of the photodiode chip is opposed to a light emitting surface of the optical fiber, the photodiode chip having a pn junction, the first region is surrounded by a second region of the second conductivity type formed at a portion of the semiconductor layer. The second region has the same or larger depth as or than that of the first region. Thus, even if a light is directed to the outside of the photosensing region, extra charges into the photo-sensing region is prevented. As a result, no optical lens system is necessary, and if an optical lens system is used, an inexpensive optical system may be used. Further, the device itself can be fabricated at low costs and easily.

26 Claims, 14 Drawing Sheets

SEMICONDUCTOR LIGHT DETECTING DEVICE MAKING USE OF A PHOTODIODE CHIP

RELATED APPLICATIONS

This is a continuation-in-part of (1) application Ser. No. 08/050,720 filed on Apr. 8, 1993, now pending, which is a continuation of application Ser. No. 07/751,188 filed on Aug. 29, 1991, now abandon; and (2) application Ser. No. 08/012,477, filed on Feb. 2, 1993, now pending.

BACKGROUND OF THE INVENTION

1. Field of the Invention

This invention relates to a semiconductor light detecting device for used in receivers, etc. of optical communication systems.

2. Related Background Art

In a semiconductor light detecting device for use in the optical communication using optical fibers, as exemplified in FIG. 1 (a first prior art), conventionally a photodiode chip 1 as the light detecting means is mounted on a header 2, and a lead wire 3 is bonded to the photodiode chip 1, whereby the signal light emitted from the end surface of an optical fiber 6 inserted by means of a ferrule 7 in a housing 8 is taken out to be converted into an electric signal.

A cap 4 airtightly seals the photodiode chip 1 and has a light transmitting window 5 which passes the signal light.

A condenser lens 9 is used as means for effectively applying the signal light emitted from the end surface of the optical fiber 6. to the photodiode chip 1. The device of FIG. 1 is called coaxial type.

On the other hand, a semiconductor light detecting device (a second prior art) shown in FIG. 2 is called butterfly type. The device of this type has a housing 8 of rectangular section. This type has the same function as the first prior art of FIG. 1, but it is possible to disposed an IC (integrated circuit) on a header 2 secured inside a housing 8 to amplify to some extent a photocurrent (photoelectric current signal) generated in the pn junction of the photodiode chip 1 as the light detecting means and take out the amplified photocurrent.

The photodiode chip 1 light detecting means comprises, as shown in FIG. 3, an epitaxial layer (semiconductive crystal layer) 12 grown on a semiconductor substrate 11, and a diffusion region (first region) 13 formed on a surface of the epitaxial layer 12 and having a polarity opposite to that of the epitaxial layer 12 by diffusing a metal element.

Since the interface between the epitaxial layer 12 and the diffusion region 13 has a pn junction, a generated photoelectric current is taken out as an electric signal through electrodes 14, 17.

FIGS. 4 and 5 respectively show a top view and an X—X sectional view of a structure of the photodiode chip 1 described above (FIG. 3). As shown, in the photodiode chip 1, a semiconductive crystal layer 12 of a first conductivity type including a light absorption layer is laminated on a surface of a semiconductor substrate 11 of a first conductivity type having an electrode 17 of the first conductivity type formed on an underside there, and impurities are selectively diffused into the semiconductive crystal layer 12 to form a first region 13 of the second conductivity type. This is a pin photodiode structure where the semiconductor substrate 11 is an n layer (or a p layer), the semiconductive crystal layer 12 is an i layer and the first region 13 is a p layer (or an n layer), and a photo-sensing region 18 is formed in the i layer. An electrode 14 of a second conductivity type is formed on the first region 13 on the surface of the semiconductor crystal layer 12, and the first region 13 inside the electrode 14 is covered with an anti-reflection film 16 while the semiconductive crystal layer 12 outside the electrode 14 is covered with a protection film (i.e. passivation film) 15.

When a reverse bias is applied to the semiconductor device thus constructed, a depletion layer is created in a pn junction area in the semiconductive crystal layer 12. Thus, an electric field is developed in the depletion layer and electrons and holes generated by a light applied to the photo-sensing region 18 are directed to the first conductivity type semiconductor substrate 11 and the second conductivity type region 13, respectively, and accelerated thereby. In this manner, a photocurrent is taken out and a light signal is detected.

In the structure shown in FIGS. 4 and 5, when the light is applied to the photo-sensing region 18, light generating carriers are captured by the depletion layer and a good response characteristic is offered. However, when the light is directed to the outside of the region 18, the generated carriers reach the pn junction while they are diffused by a density gradient and are taken out as a photocurrent. As a result, the response characteristic is adversely affected. FIG. 6 shows a response characteristic of the photodiode chip 1. Since the movement of the carriers by the diffusion is slow, a response waveform for a light pulse includes a tail at the end as shown in FIG. 6.

When such a photodiode chip 1 is used for the light communication, a light emitted from an optical fiber is condensed so that it is directed to the photo-sensing region 18. However, when a portion of light leaks out of the photo-sensing region 18, it leads to the reduction of the response speed of the photodiode chip 1 by the reason described above. In a high speed photodiode chip, the area of the photo-sensing region 18 is reduced to reduce a junction capacitance. As a result, a ratio of light directed to the outside of the photo-sensing region 18 increases and a diffused component which has a low response speed increases. This leads to the degradation of the response speed.

These conventional semiconductor light detecting devices have the following problems.

In a case in which a single mode fiber or a multimode fiber is used as the optical fiber 6, for, e.g., light of 1.3 $\mu$m band, the core is about 10 $\mu$m in diameter for the single mode fiber, and about 50 $\mu$m in diameter for the multimode fiber. The light emitted from the end surface of the optical fiber disperses at an angle corresponding to a refractive index difference between the core and the cladding of the optical fiber 6.

The condenser lens 9 is essentially used to condense this dispersing signal light to the light detecting surface of the photodiode chip 1 as the light detecting means. In particular, in high-speed photodiodes of small light detecting diameters below 100 $\mu$m, an aspherical lens or a selfoc lens with a better condensing property is often used. Thus expensive parts must be used.

Even in the case where this expensive lens is used, very high precision is required to align the lens 9 and the optical fiber 6. In particular, in fixing the condenser lens 9 to the part B in FIG. 1, to keep a dispersion of sensitivities of the pn junction as the light detecting region (first region 13) of the photodiode chip within ±0.5 dB, an allowance of the precision error must be about 15 μm for the accurate alignment between the lens 9 and the optical fiber 6.

To fix the part, spot welding by a YAG laser (Yttrium Aluminum Carnet Laser) is most commonly used. But a positional displacement of the fixed part can take place, and the yield is as low as 70~80%. In addition it takes as much 20~30 minutes for one alignment.

What is especially a problem is a case where a condensed beam (signal light emitted from the end surface of the optical fiber) is radiated to parts other than the light detecting region of the photodiode chip (the arrow in FIG. 3 represents a divergence of a beam radiated from the core 6' of the optical fiber 6).

A part of the signal light absorbed in the light detecting region (first region 13) and its surroundings, (e.g., 3~5 μm) contributes to the generation of a photoelectric current effectively at high speed because of an electric field applied to the pn junction, but because of the absence of an electric field a part of the signal light absorbed outside the light detecting region and its surroundings adversely generates a photoelectric current of very low response speed.

As a result of the latter case, in reproducing an analog signal light (photoelectric conversion), a resultant signal may be phase shifted with a high distortion level. A problem is that a reproduced signal waveform has noise. In reproducing a digital signal light (photoelectric conversion), a reproduced signal waveform has a distortion (in particular, a rectangular pulse has a dragging trailing edge of μsec at the fall), and high-speed communication cannot be performed.

In these circumstances, to remove these problems the signal light emitted from the end surface of the optical fiber has be condensed to the light detecting region (pn junction) of the photodiode chip through an expensive and high-quality optical lens system.

Although the afore-mentioned semiconductor light detecting device is essential to optical communication, this particular semiconductor light detecting device has the above described problems and in addition, is expensive, which hinders the progressive prevalence of the optical communication system.

SUMMARY OF THE INVENTION

An object of the present invention is to solve the above-described problems, secure stable operations, and to simplify the fabrication and structure of a semiconductor light detecting device itself.

A semiconductor light detecting device according to the first embodiment of this invention comprises a housing with an optical fiber inserted in and secured to a header with a photodiode chip mounted integrally therewith, a light detecting surface of the photodiode chip being opposed to a signal light emitting end surface of the optical fiber, and the photodiode chip having a pn junction area, as a photo-sensing region, formed by selectively providing a first region of a second conductivity type in a portion of a semiconductive layer of a first conductivity type. The first region is surrounded by a second region of the second conductivity type formed in a portion of the semiconductive layer, and the second region has the same or a deeper depth than that of the first region.

Accordingly, even if the light is directed outside of the photo-sensing region, charges are absorbed by the second region and the flow of the charges into the photo-sensing region is prevented. Thus, only the required photocurrent is taken out to an external circuit.

It is further effect of a top-entry type photodiode chip used in a semiconductor laser device of this invention having a pn junction area, as a photo-sensing region, formed by selectively providing a first region of a heavily doped second conductivity type into a portion of a lightly doped semiconductive layer formed on a semiconductor substrate of a heavily doped first conductivity type, characterized in that the first region is surrounded by a second region of the second conductivity type formed in a portion of said semiconductive layer.

According to this invention, because the photodiode chip as the light detecting means is provided by a photodiode chip including a region for capturing unnecessary reactive carriers, few signal waveform distortions take place even when signal light is radiated from the end surface of the optical fiber without an optical lens system disposed therebetween.

According to the second and third embodiments of this invention, because the photodiode chip as the light detecting means is provided by the photodiode chip described above, few signal waveform distortions occur even when signal light is applied from the end surface of the optical fiber to the photodiode chip with an inexpensive spherical lens disposed therebetween.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DETAILED DESCRIPTION OF THE PREFERRED EMBODIMENTS

The semiconductor light detecting device according to this invention of this application is depicted with reference to FIGS. 7 to 20.

Figure 7:
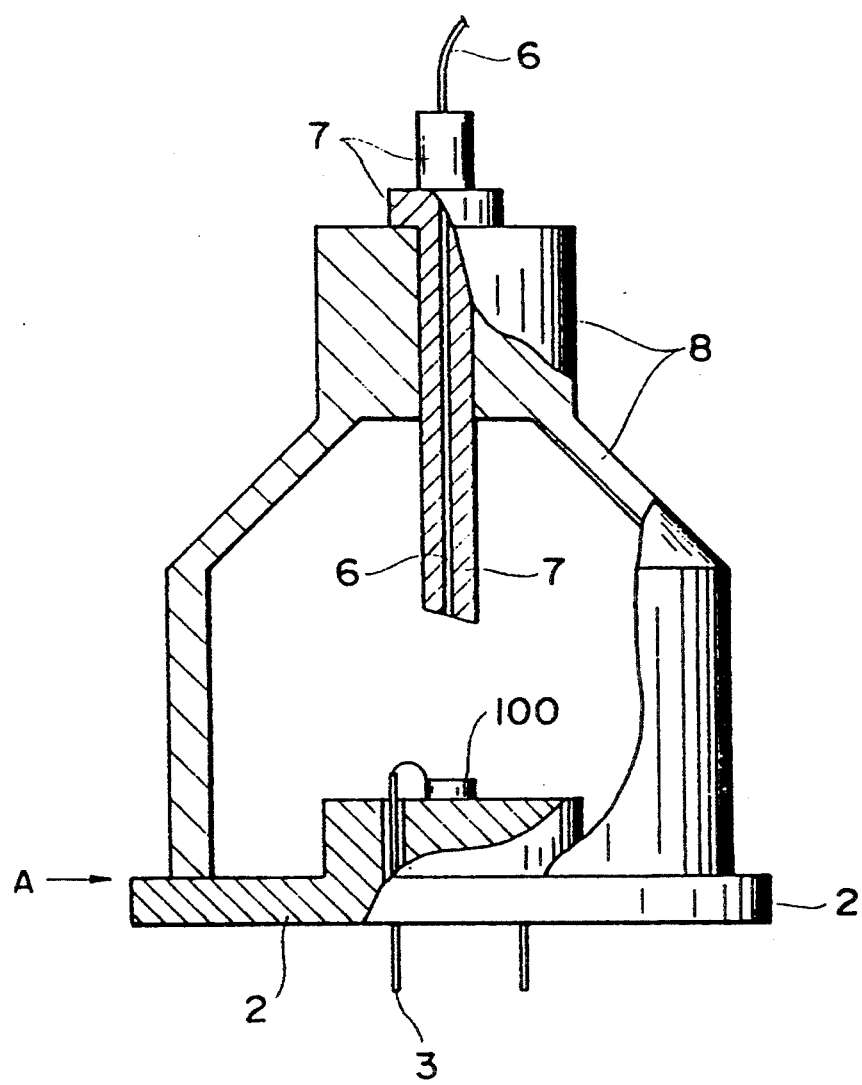
FIG. 7 is a broken side view of the semiconductor light detecting device according to a first embodiment of this invention.

FIG. 7 is a side view of the semiconductor light detecting device according to a first embodiment of this invention with a major portion of the housing removed.

Figure 1:
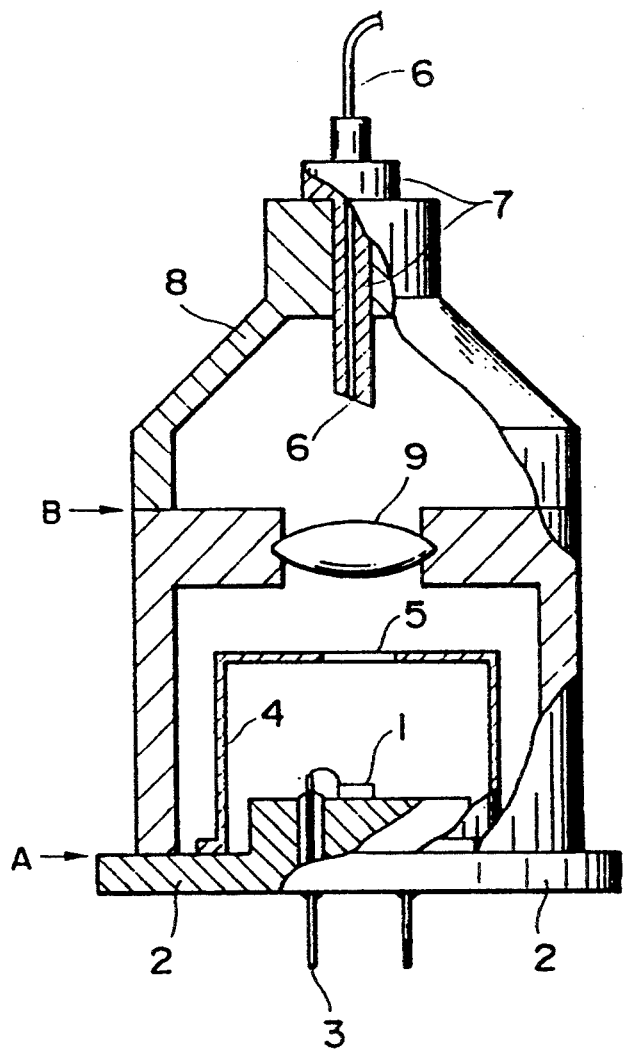
FIG. 1 is a broken side view of a first example of the conventional semiconductor light detecting device.
Figure 2:
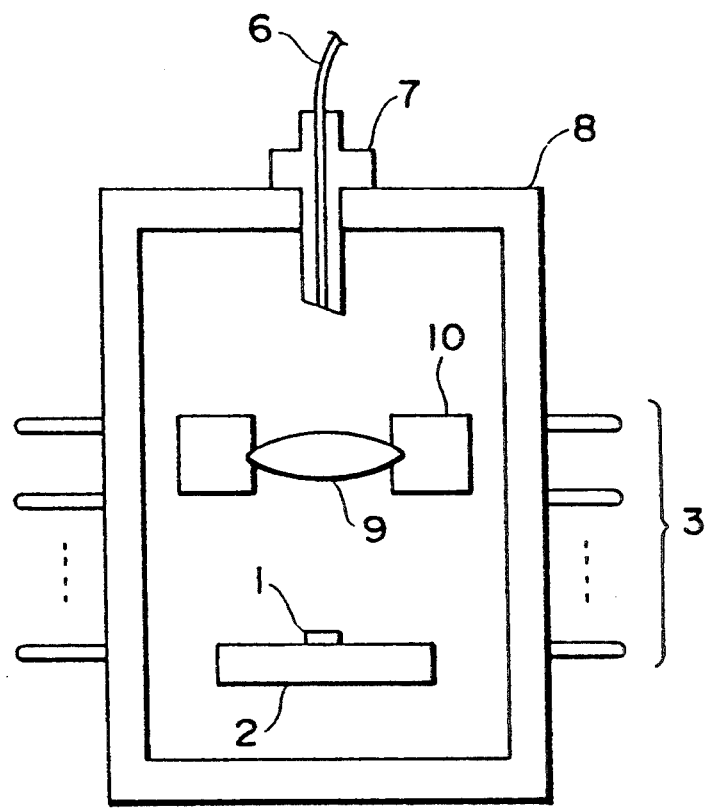
FIG. 2 is a sectional view of a second example of the conventional semiconductor light detecting device.
Figure 3:
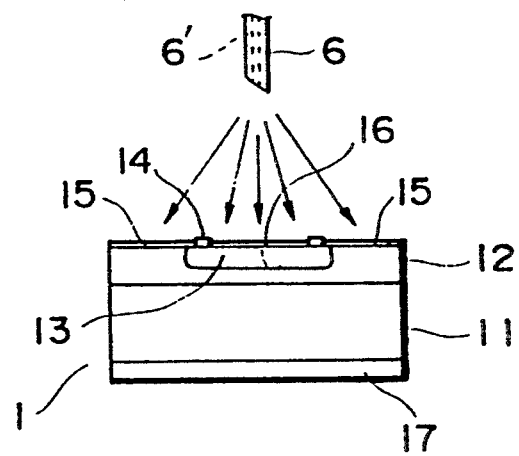
FIG. 3 is a sectional view of a photodiode chip installed in the conventional semiconductor light detecting device.
Figure 4:
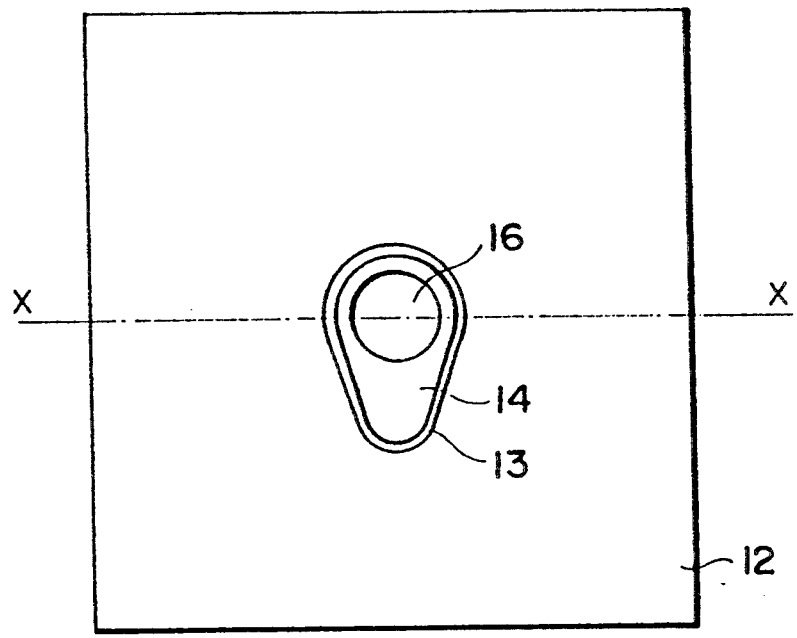
FIGS. 4 and 5 respectively show a structure of a conventional photodiode chip.
Figure 5:
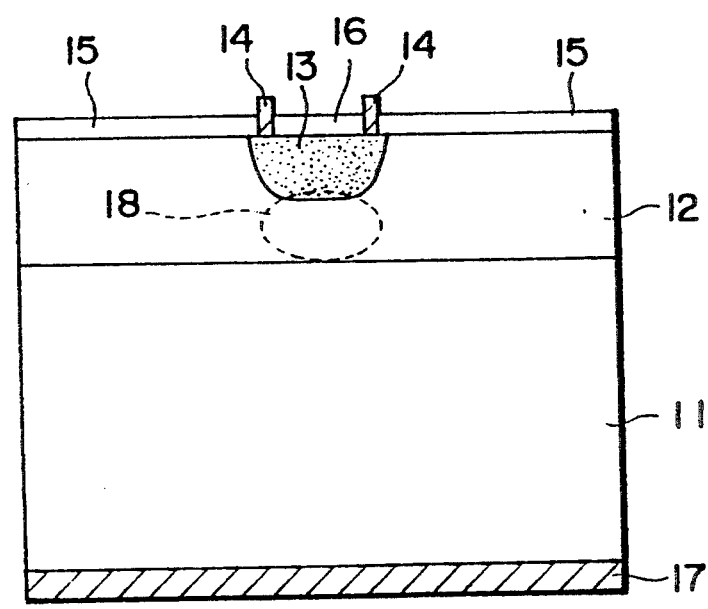
Figure 6:
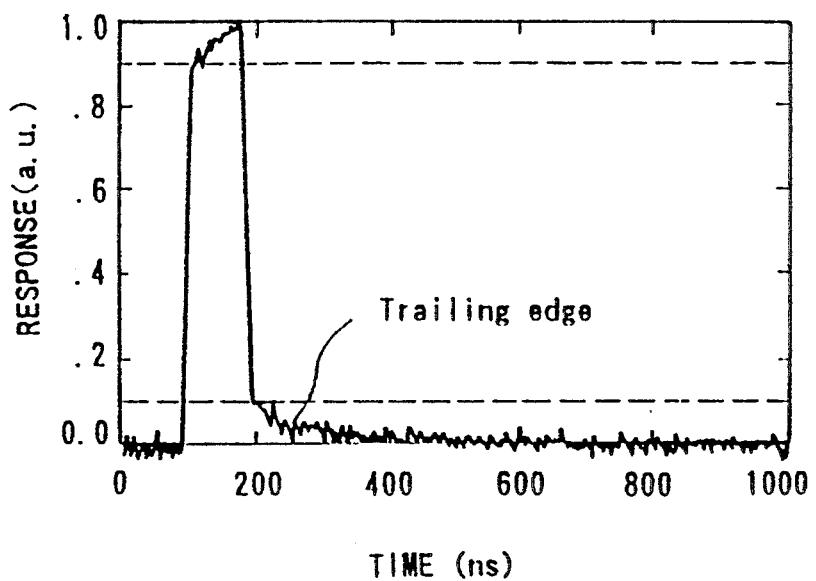
FIG. 6 shows a light pulse response characteristic measured for the conventional photodiode chip shown in FIGS. 4 and 5.
Figure 8:
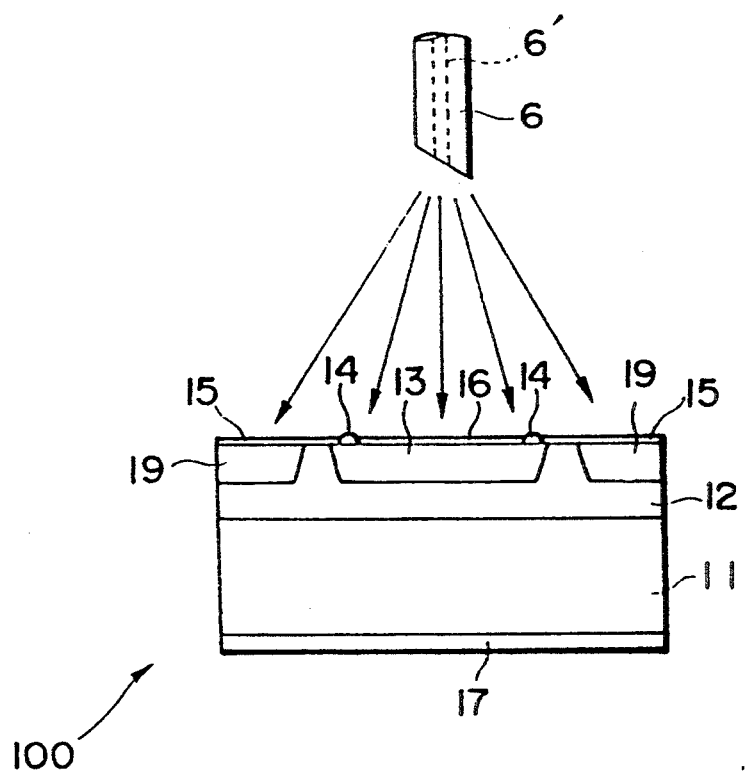
FIG. 8 is a sectional view of a charge capturing photodiode chip used in this invention.

Differences of the semiconductor light detecting device according to this embodiment from the conventional semiconductor light detecting devices (FIG. 1) are that a photodiode chip, which is the light detecting device, a photodiode chip of the type (hereinafter called charge capturing photodiode chip) that a photocurrent generated by the signal light radiated to a peripheral part of the pn junction, which is the light detecting region, can be made unreactive. One example of such light detecting device is shown in FIG. 8. The optical fiber 6 is positioned relative to the photodiode chip 100 to obtain a required sensitivity without the use of an optical lens system disposed therebetween.

As shown in FIG. 7, the photodiode chip 100 is mounted on a header 2, and a housing 8 is integrated with the header 2. An optical fiber 6 inserted into the housing 8 through a ferrule 7. The light emitting end surface of the optical fiber 6 and the light detecting surface of the photodiode chip 100 are opposed to each other with no optical lens system.

Figure 9:
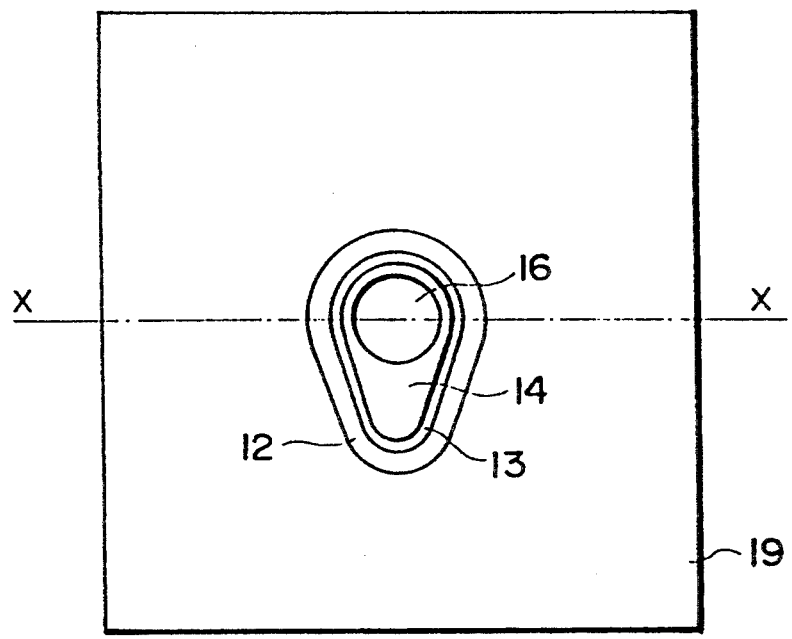
FIGS. 9 and 10 respectively show a basic structure of a charge capturing photodiode chip used in this invention.
Figure 10:
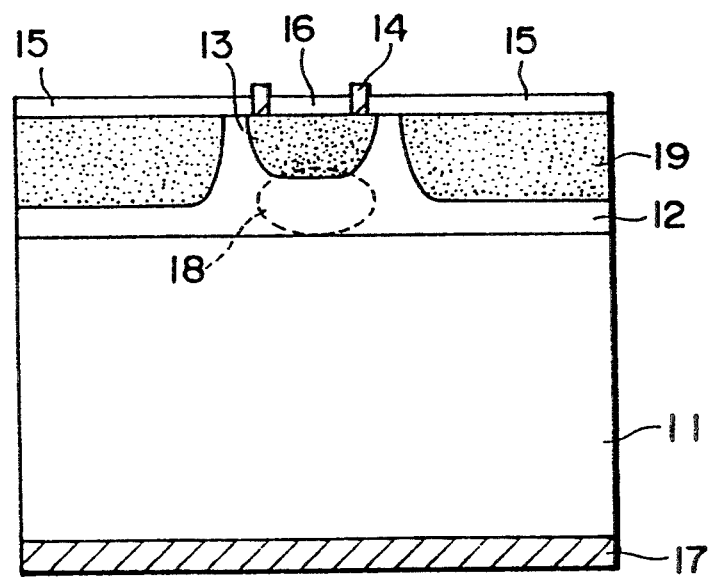

FIGS. 9 and 10 respectively show a basic structure of a photodiode chip 100 used in this invention. FIG. 9 shows a top view and FIG. 10 shows an X—X sectional view. As shown a semiconductor crystal layer 12 of a lightly doped first conductivity type is formed on a surface of a semiconductor substrate 11 of a heavily doped first conductivity type having an n-electrode 17 formed on an underside thereof, and a first region 13 of a second conductivity type is formed in the semiconductor crystal layer 12 by impurity diffusion. A pn junction area formed by the provision of the first region 13 is used as a photo-sensing region 18. The first region 13 is surrounded by the second region 19 of the second conductivity type formed by the impurity diffusion. A p-electrode 14 is formed on the first region 13 on the surface of the semiconductive crystal layer 12, and an anti-reflection film 16 is formed on the first region 13 inside the electrode 14 while a film 15 is formed on the semiconductive crystal layer 12 outside the electrode 14.

In this structure in which the semiconductive crystal layer 12 is used as an i layer of a pin photodiode, generally, the addition of the impurities is not performed in the crystal growth. But the semiconductive crystal layer 12 may become the first conductive type semiconductor layer by locally stoichiometric shift in some kind of the material or by mixture of the impurities from a crystal growing apparatus etc. Further, in order to improve the electrical characteristics of a diode, the impurities may be added in formation of the semiconductor crystal layer 12. Therefore, in the present application, the meaning of "lightly doped" also includes a case that "the intentional addition of the impurities is not performed".

When a reverse bias is applied to the semiconductor device thus constructed, a depletion layer is created in the pn junction area in the semiconductive crystal layer 12. Thus, an electric field is developed in the depletion layer and electrons and holes generated by the light directed to the photo-sensing region 18 are directed to the first conductivity type semiconductor substrate 11 and the second conductivity type region 13, respectively, and accelerated thereby. In this manner, a photocurrent is taken out and a light signal is detected. On the other hand, when the light is directed to the outside of the photo-sensing region 18, undesired carriers are absorbed by a depletion layer created by the second region 19 which is deeply formed in the semiconductive crystal layer 12. Accordingly, only the photocurrent required for the detection of the light signal can be taken out. A structure for absorbing the undesired charges by an impurity layer is disclosed in Japanese Laid-Open Patent Application No. 96719/1978, which teaches the provision of the impurity layer in order to prevent interference between a photodiode chip and a scan circuit in an image sensor. However, the improvement of the response speed which is the object of the present invention is not attained.

Figure 11:
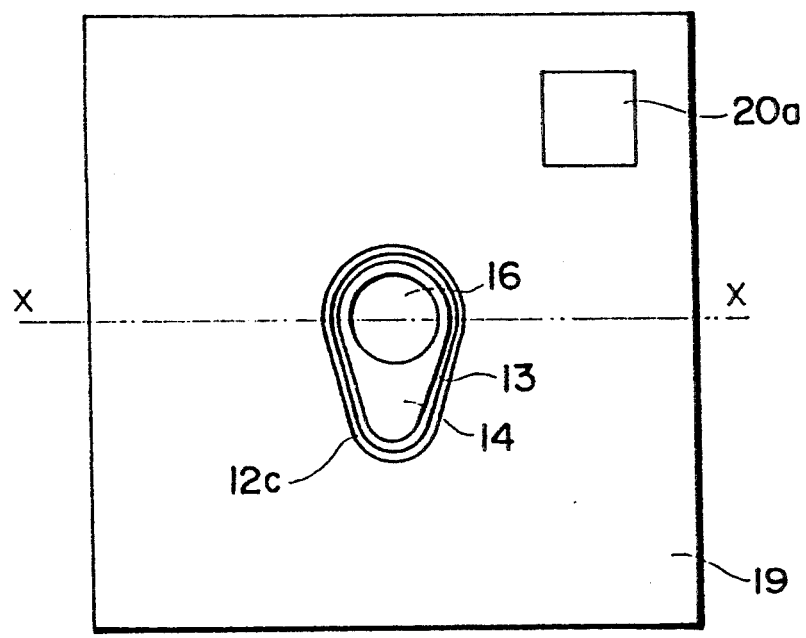
FIGS. 11 and 12 respectively show a first structure of a charge capturing photodiode chip used in this invention.
Figure 12:
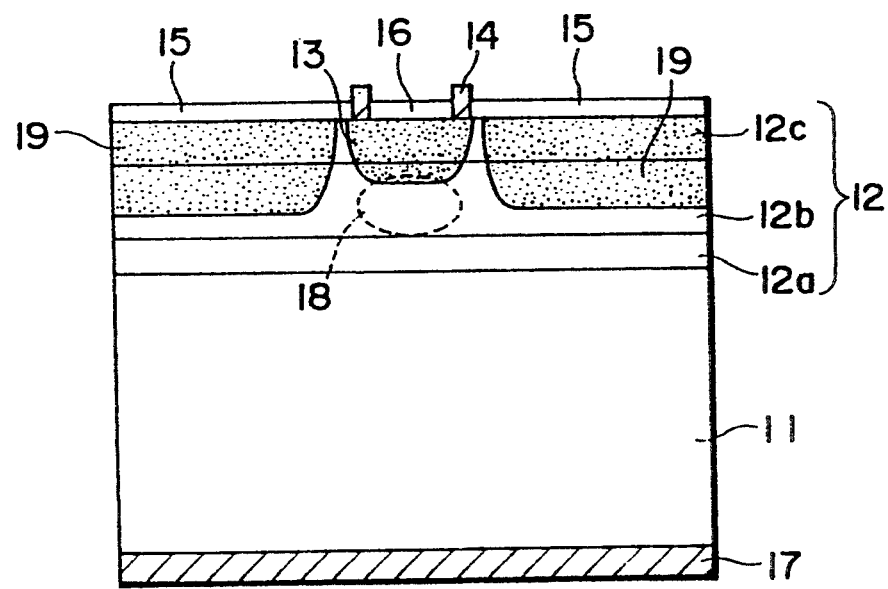
Figure 13:
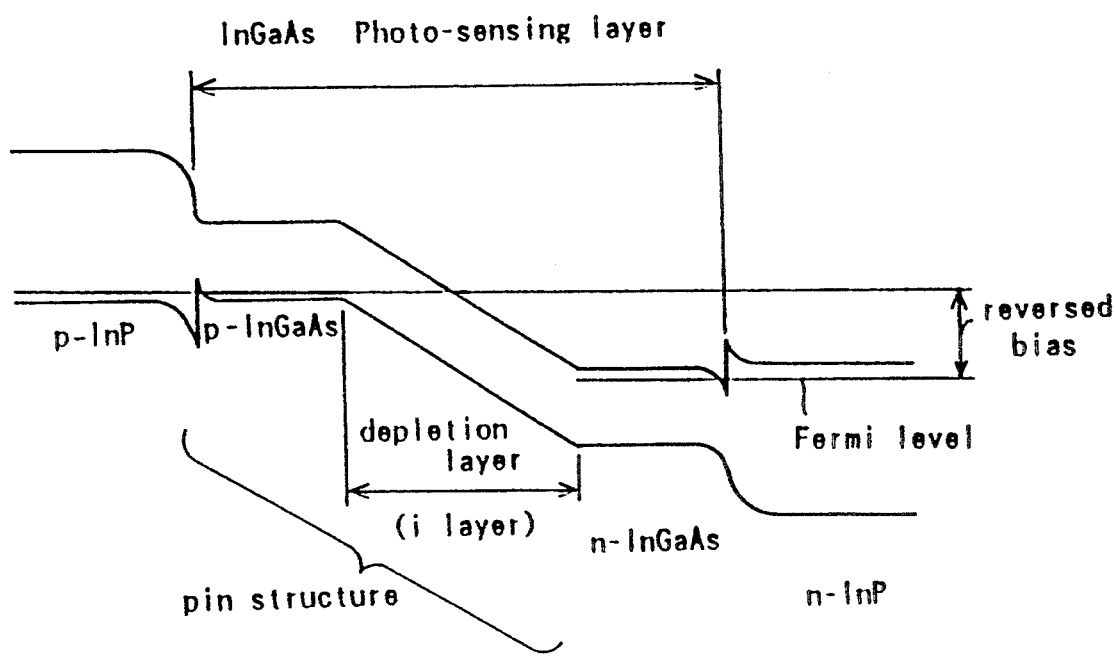
FIG. 13 shows a band gap energy chart of the photodiode chip in FIGS. 11 and 12.

Specific embodiments based on the above basic structure are now explained. FIGS. 11 and 12 respectively show a first structure of the photodiode chip 100 used in this invention. FIG. 12 shows a top view and FIG. 13 shows an X—X sectional view. As shown, an n-type InP buffer layer 12a (dopant concentration $n=2\times10^{15}$ cm$^{-3}$, thickness 2 $\mu$m), an n-type InGaAs (indium-gallium-arsenide) absorbing layer 12b ($n=2\times10^{15}$ cm$^{-3}$, thickness 3.5 $\mu$m) and an n-type InP window layer 12c ($n=2\times10^{16}$ cm$^{-3}$, thickness 2 $\mu$m) are formed on a surface of an n$^+$-type Inp (indium-arsenide) semiconductor substrate 11 ($n=2\times10^{18}$ cm$^{-3}$) having an n-electrode 17 formed on an underside thereof. A first region 13 and a second region 19 of a p type are formed on the photo-sensing layer 12b and the window layer 12c by selective diffusion of Zn (zinc) by a sealed ampoule method (impurity doping method using a sealed silica tube including a semiconductor wafer and an impurity material). A p-electrode 14 is formed on the first region 13 in the semiconductive crystal layer 12, and an anti-reflection film 16 is formed on the region 13 inside the electrode 14 and a protection film 15 is formed outside the electrode 14. An electrode 20a for taking out the charges collected at the second region 19 is formed on the semiconductive crystal layer 12.

A band gap energy chart of the pin structure is shown in FIG. 13. In this structure, the composition of In Ga As of the absorbing layer 12b is In$_{0.53}$Ga$_{0.47}$As. This composition provides the smallest band gap energy, that is, can sense the longest wavelength light among the InGaAsP semiconductors which can be lattice-matched with the InP layer.

It is preferable that the thickness of the absorbing layer 12b is between 1 $\mu$m and 7 $\mu$m to attain efficient absorption of the incident light, although it is not limited thereto. It is further preferable that a width of the n type region between the first region 13 and the second region 19 is between 5 μm and 30 μm to attain good response characteristic and electrical characteristic, although they are not limited thereto. In this structure, a diameter of the first region 13 is 100 μm.

When a light having a wavelength of 1.3 μm is applied to the photodiode chip 100 thus constructed, if the light is directed to the outside of the photo-sensing region 18, undesired charges are collected by the depletion layer created by the second region 19 deeply formed in the semiconductive crystal layer 12 as described above. When the depth of the second region 19 is deeper than that of the first region 13, a capturing effect for extra charges is higher, because the extra charges are generated in the absorbing layer outside the photo-sensing region 18 and diffuse into the photo-sensing region 18 by the density graduation. Accordingly, the second region 19 may be deep enough to reach the buffer layer 12a. However, it is not necessary that the second region 19 be so deep. For example, when the first region 13 and the second region 19 are simultaneously formed, they are of the same depth. In this case, the same effect as that of the present embodiment can be attained. However, when the second region 19 is shallower than the first region 13, the above effect is not attained.

Figure 14:
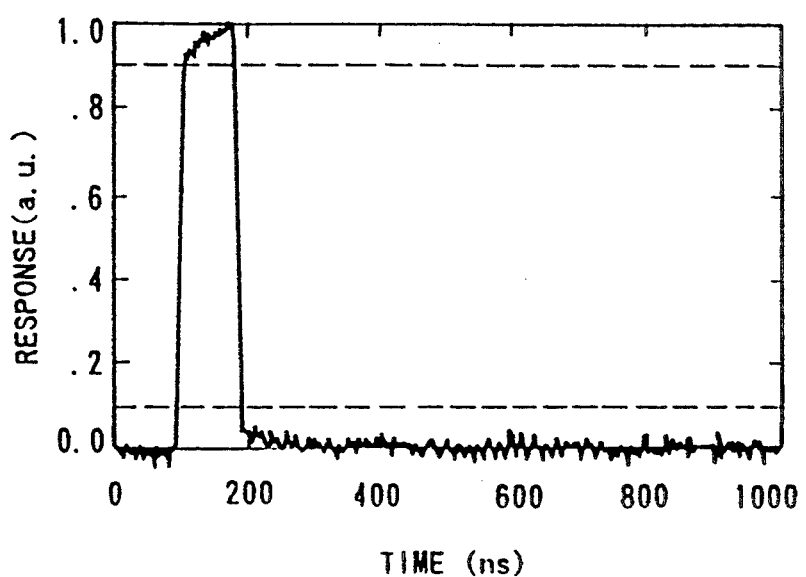
FIG. 14 shows a light pulse response characteristic measured for the photodiode chip in FIGS. 11 and 12.

Only the photocurrent necessary for the detection of the light signal can be taken out by the above structure. The response speed of the photodiode chip 100 was measured, as shown in FIG. 14. The end of the waveform includes no tail and no degradation of the response speed by stray light directed to the outside of the photo-sensing region 18 was confirmed.

In this structure, the incident light has a wavelength of 1.3 μm. Since the photo-sensing layer 12b is the $In_{0.53}Ga_{0.47}As$ layer, the same effect is attained for an incident light of a long wavelength such as 1.55 μm.

Figure 15:
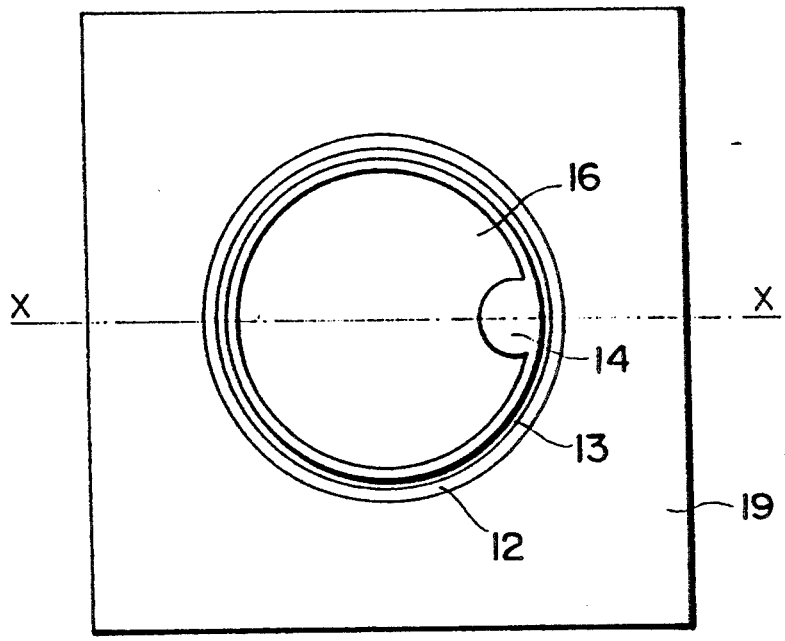
FIGS. 15 and 16 respectively show a second structure of a charge capturing photodiode chip used in this invention.
Figure 16:
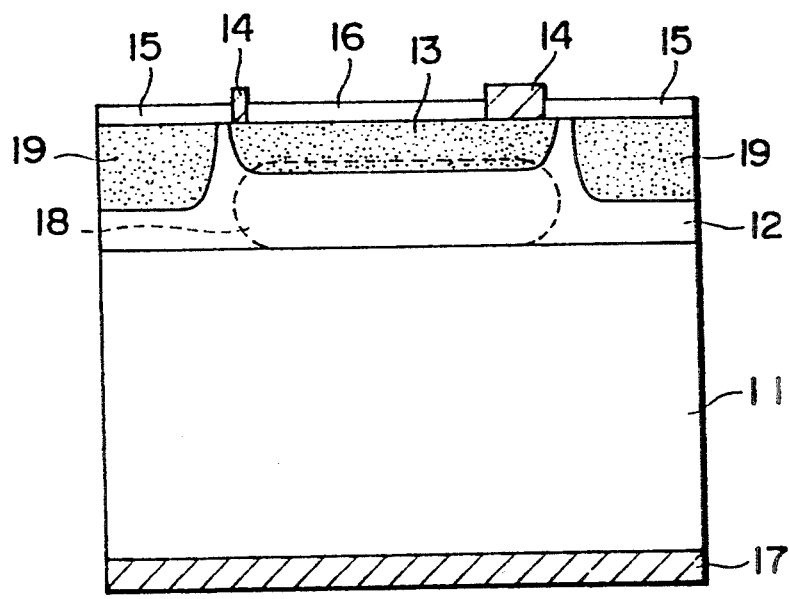

A second structure of the photodiode chip 100 is now explained with reference to FIGS. 15 and 16. FIG. 15 shows a top view and FIG. 16 shows an X—X sectional view. In the present structure, an n-type $In_{0.53}Ga_{0.47}As$ absorbing layer ($n=1\times10^{15}$ cm$^{-3}$ thickness 5 μm) is formed, as a semiconductive crystal layer 12, on a surface of an n+-type InP substrate 11 having an n- electrode 17 formed on an underside thereof, and a first region 13 and a second region 19 of p type are formed by the selective diffusion of Zn. A diameter of the first region 13 is 300 μm and a width of an n type region between the first region 13 and the surrounding second region 19 is 20 μm. A p-electrode 14 is formed on the first region 13 of the absorbing layer, and an anti-reflection film 16 is formed on the first region 13 inside the electrode 14 and a protection film 15 is formed on the semiconductive crystal layer 12 outside the electrode 14. In this structure, the charges generated by the light directed to the outside of the photo-sensing region 18 are collected to the second region 19 so that the degradation of the response speed is prevented.

Figure 17:
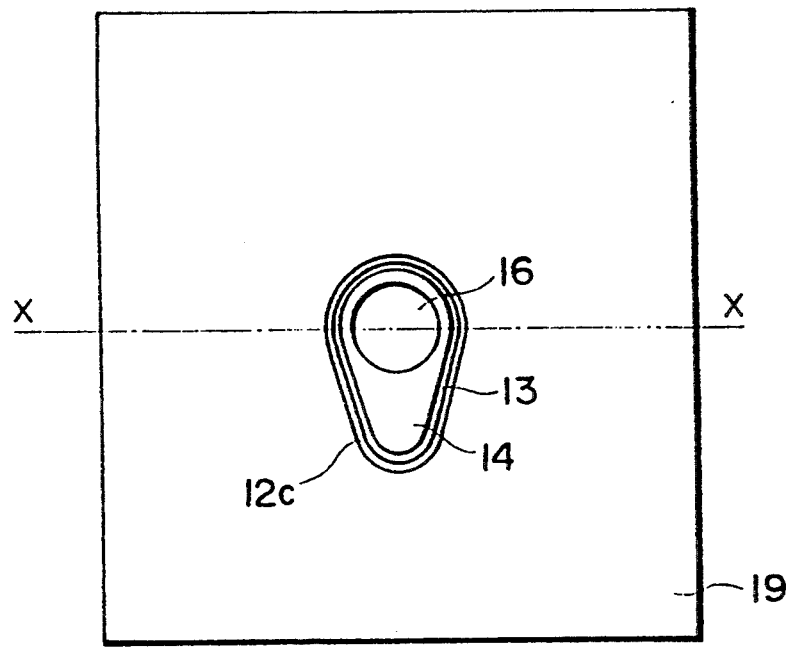
FIGS. 17 and 18 respectively show a third structure of a charge capturing photodiode chip used in this invention.
Figure 18:
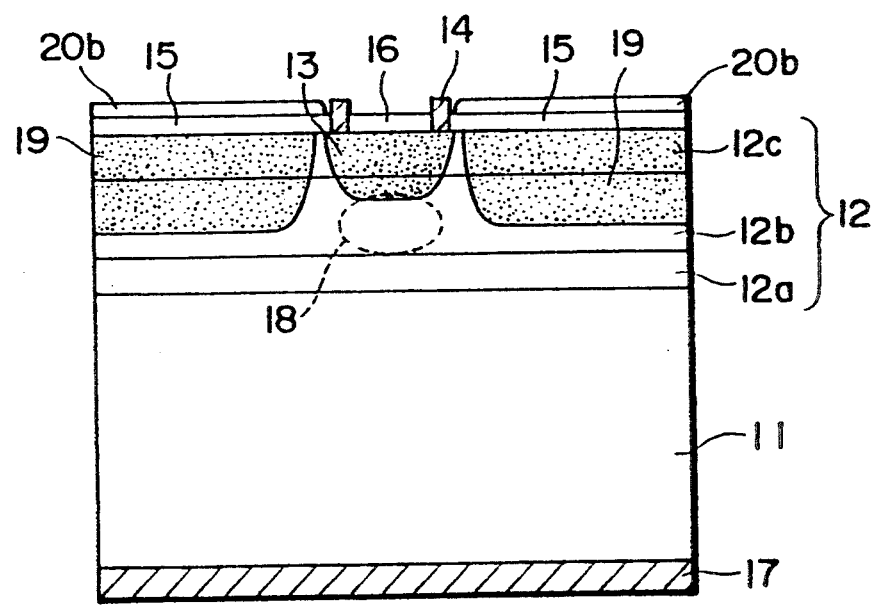

A third structure of the photodiode chip 100 is now explained with reference to FIGS. 17 and 18. FIG. 17 shows a top view and FIG. 18 shows an X—X sectional view. As shown, an n-type InP buffer layer 12a ($n=2\times10^{15}$ cm$^{-3}$, thickness 2 μm), an n-type $In_{0.53}Ga_{0.47}As$ absorbing layer 12b ($n=2\times10^{15}$ cm$^{-3}$, thickness 3.5 μm), and an n-type InP window layer 12c ($n=2\times10^{16}$ cm$^{-3}$, thickness 2 μm) are formed on a surface of an n+-type InP semiconductor substrate 11 ($n=2\times10^{18}$ cm$^{-3}$) having an n-electrode 17 formed on an underside thereof. Further, a first region 13 and a second region 19 of p-type are formed in the photo-sensing layer 12b and the window layer 12c by the selective diffusion of Zn(zinc) by the sealed ampoule method. A p-electrode 14 is formed on the first region 13 in the semiconductor crystal layer 12, and an anti-reflection film 16 is formed on the region 13 inside the electrode 14 and a device protection film 15 is formed outside the electrode 14. A metal film 20b is formed on the protection film 15 to surround the first region 13. A spacing between the metal film 20b and the p-electrode 14 is maintained at 5 μm.

It is preferable that the thickness of the photo-sensing layer 12b is between 1 μm and 7 μm in order to attain efficient absorption of the incident light, although it is not limited thereto. Further, it is preferable that a diameter of the first region 13 is 100 μm, and the width of the n type region between the first region 13 and the second region 19 is between 5 μm and 30 μm in order to attain good response characteristic and electrical characteristic although it is not limited thereto.

In this structure, since the light directed to the outside of the photo-sensing region 18 is reflected by the metal film 20b, the generation of extra charges is prevented and the degradation of the response speed is effectively prevented.

The semiconductor materials and the dimensions thereof are examples and they change depending on applications and wavelengths. For example, the semiconductor materials may be compound semiconductors such as GaAs (gallium-arsenide), AlGaAs (aluminum-gallium-arsenide), CdTe (cadmium-telluride), HgCdTe (mercury-cadmium-telluride), InSb (indium-antimonide), or Si (silicon) or Ge (germanium). The impurity diffusion may be done by an ion implantation method.

In accordance with the present invention, the degradation of the response speed is prevented by the simple means of depleting a portion of the light absorption region around the photo-sensing region and collecting the charges generated by the light directed to the outside of the photo-sensing region, and the highly sensitive photodiode chip is provided.

Even in the case in which such improved photodiode chip 100 is used as the light detecting means, a generated photocurrent contains no component of slow response speed even in a condition in which a beam emitted from the end surface of the optical fiber 6 is divergent. Accordingly it is unnecessary to use expensive lenses, and make subtle alignment of the optical fiber with the lenses. Inexpensive semiconductor light detecting devices can be very easily fabricated.

This photodiode chip 100 is bonded to the header 2 of cover by using AuSn and the photocurrent signal is led outside by a Au wire of 30 μm in diameter and a metal lead 3. Then an optical fiber 6 having the signal light emitting end surface cut off at 8 degrees for the prevention of return light is fixed to a ferrule 7, and the ferrule 7 is secured to a stainless housing 8. A fixation position of the ferrule 7 is set at a geometrical optically computed value of a distance between the light detecting surface of the photodiode chip 100 and the leading end of the optical fiber 6 corresponding to a light detecting surface area of the photodiode chip 100.

Then, applying 1.3 μm-laser beams from the optical fiber 6 to the light detecting surface of the photodiode chip 100, and monitoring the photocurrents, the housing 8 is secured at the part A to the header 2 by a YAG laser welding machine. Because of the absence of a lens, actually in this operation, the core alignment and the welding can be completed in a short period of time (2~3 minutes), and 95% of thus-fabricated semiconductor light detecting devices exhibit a responsivity as high as 0.8 A/W.

In receiving 125 Mbps light signals by the digital communication by the use of the thus-fabricated semiconductor light detecting device, waveform distortions, and phenomena, such as jitters in which rises and falls of waveforms transiently deflect, are not observed at all. In the case where this semiconductor light detecting device is used as the light detecting part of a 40 channel analog image transmission device, the responsivity is sufficiently 0.8 A/W. Conventionally in spite of a high sensitivity thereof, because of phase-shifted signals due to a little leakage light, flicks appear in screens, but by the use of the semiconductor light detecting device according to this embodiment, no flicks appear. Since all the unnecessary light (undesired carriers) is absorbed by the second region 19, neither reflected light nor scattered light, which result in noises in the optical communication, take place.

Because optical fibers can be thus mounted on the semiconductor light detecting device in a short period of time which leads to lower costs, and no waveform distortions and noises occur in a number of applications, the semiconductor light detecting device according to the first invention of this application provides wide applications of the optical communication which have been slow because of the expense of the conventional semiconductor light detecting devices. In another embodiment of this invention, the semiconductor light detecting device may be applied to a butterfly-type housing with a result of the same effect.

The semiconductor light detecting device according to a second embodiment of this invention will be explained with reference to FIG. 19.

Differences of the semiconductor light detecting device according to this embodiment from the conventional semiconductor light detecting devices (FIG. 1) are that as a photodiode chip 100, which is the light detecting device, a photodiode chip of the type (hereinafter called charge capturing type photodiode chip) that a photocurrent generated by the signal light radiated to a peripheral part of the pn junction, which is the light detecting region, can be made unreactive, and the light emitted from the end surface of an optical fiber is applied to the light detecting surface of the photodiode chip 100 by an inexpensive spherical lens 200 as an optical lens system disposed therebetween.

Figure 19:
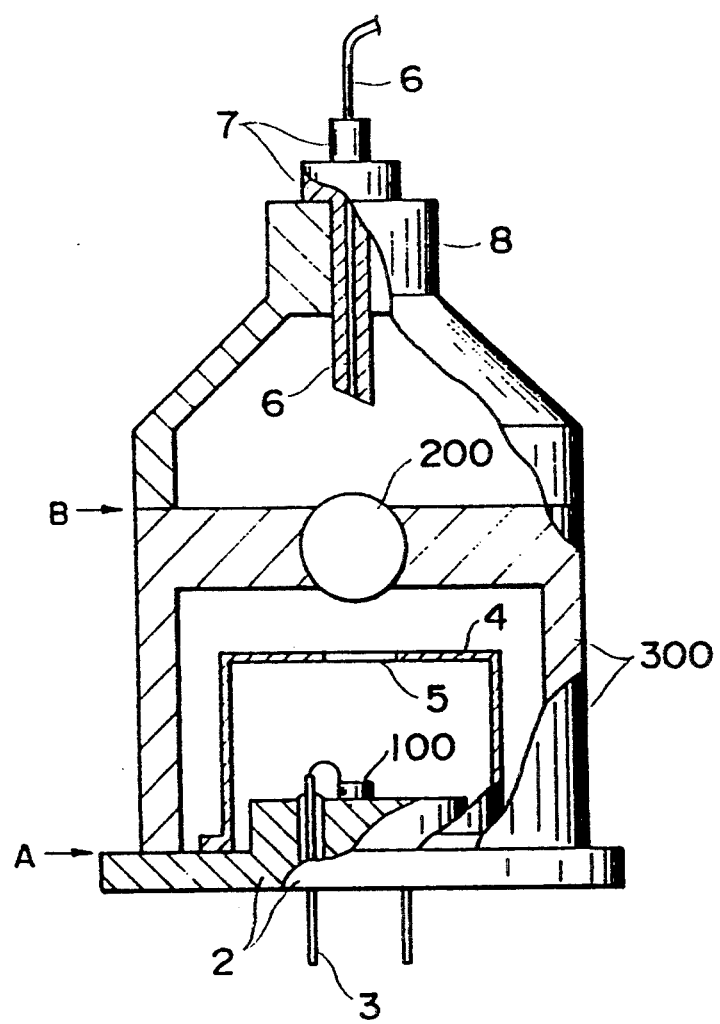
FIG. 19 is a broken side view of the semiconductor light detecting device according to a second embodiment of this invention.

As shown in FIG. 19, the photodiode chip 100 is mounted on a header 2, and the housing 8 is integrated with the header 2. An optical fiber 6 is inserted into the housing 8 through a ferrule 7, and the light emitting end surface of the optical fiber 6 and the light detecting surface of the photodiode chip 100 are opposed through the spherical lens 200. Then, the photodiode chip 100 are airtightly sealed by a cap 4 with a light transmitting window 5, and the interior of the cap 4 is filled with inert element (for example nitrogen gas, etc. ).

As the photodiode chip which can be used in the second embodiment of the semiconductor light detecting device according to this invention can be used a charge capturing photodiode chip 100 in which a photocurrent generated by the light radiated to a peripheral region of the pn junction, which is the photo-sensing region 18 is made unreactive. The structure of the photodiode chip 100 involved in this embodiment is the same as that involved in the first embodiment.

In using such improved photodiode chip 100, no low response speed component of a photocurrent is generated even in a state in which a light beam cannot be sufficiently condensed by the spherical lens 200. Resultantly it is not necessary to use an expensive selfoc lens, and subtly align the core of the optical fiber 6. A very simple, inexpensive semiconductor light detecting device can be fabricated.

This photodiode chip 100 is bonded to a header 2 of covar by AuSn and the photocurrent signal is led outside by a Au wire of 30 μm in diameter and a metal lead 3. Then, a lens mount 300 for holding an inexpensive ball lens 200 is welded at the part A in FIG. 19 to a header 2 by a YAG laser. A single mode fiber 6 having the signal light emitting end surface cut off at 8 degrees for the prevention of return light is fixed to a ferrule 7, and the ferrule 7 is secured to a stainless housing 8.

Then, while 1.3 μm laser beams are applied to the light detecting surface of the photodiode chip 100 from the end surface of the optical fiber, and the photocurrents are monitored, the housing 8 is secured at the part B in FIG. 19 to the lens mount 300. Actually in this operation, the spherical lens is used, and the condensation can be low, the core alignment and the welding can be done in a short period of time (5~10 minutes), and 90% of the thus-fabricated semiconductor light detecting devices exhibits a responsivity as high as 0.85 A/W.

As in the second embodiment (FIG. 19), in receiving 125 Mbps light signals by the digital communication by the use of the thus-fabricated semiconductor light detecting device, waveform distortions, and phenomena, such as jitters in which rises and falls of waveforms transiently deflect, are not observed at all. In a case where this semiconductor light detecting device is used as the light detecting part of a 40 channel analog image transmission device, the responsivity is sufficiently 0.85 A/W. Conventionally in spite of a high sensitivity thereof, because of phase-shifted signals due to a little leakage light, flicks appear in screens, but by the use of the semiconductor light detecting device according to this embodiment, no flicks appear. Since all the unnecessary light (undesired carries) is absorbed by the second region 19, neither reflected light nor scattered light, which result in noises in the optical communication, take place.

Figure 20:
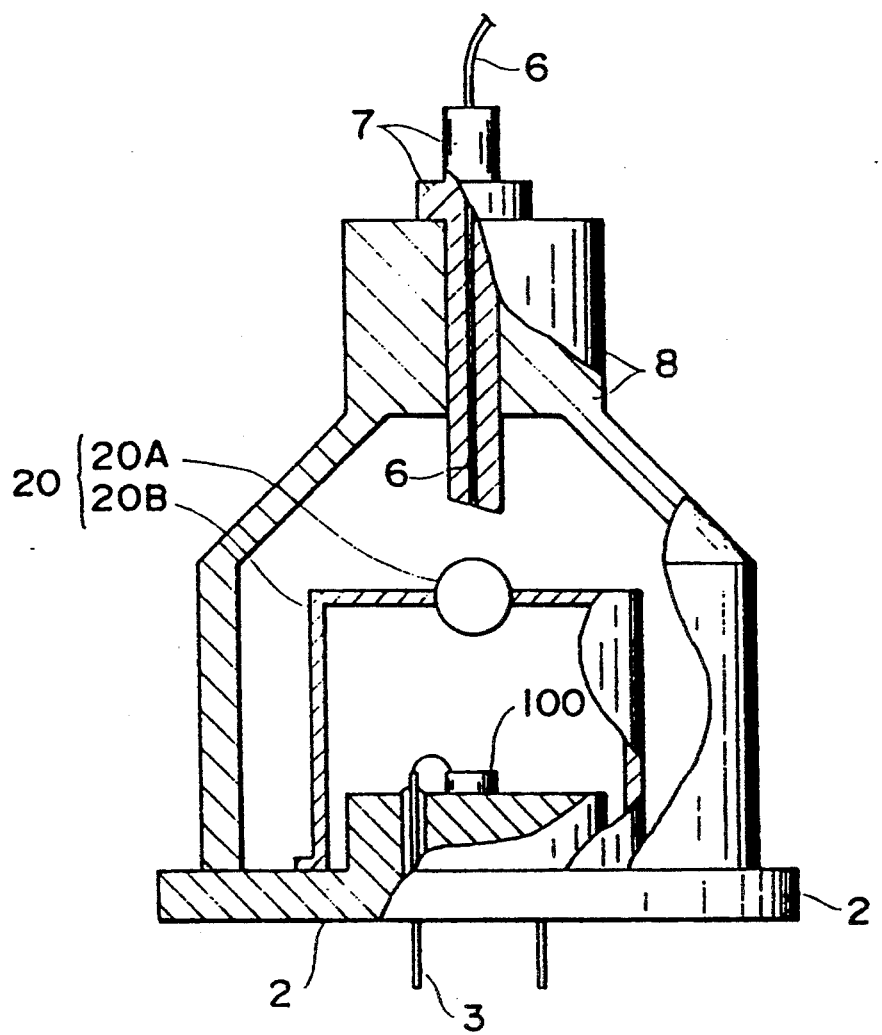
FIG. 20 is a broken side view of the semiconductor light detecting device according to a third embodiment of this invention.

FIG. 20 is a broken side view of the semiconductor light detecting device according to another embodiment of this invention. The cap 20B and the lens 20A of the embodiment of FIG. 19 are replaced by a part 20 which is usually called lens cap combining the functions of the cap 20B and the lens 20A to decrease the number of the parts.

The space airtightly closed by the header 2 and the cap 20B and accommodating the photodiode chip 100 is filled with an inert gas, e.g., nitrogen gas, in its dry state, so that even in low temperature conditions the inert gas does not bedew the surfaces of the semiconductor device.

Accordingly, an inexpensive semiconductor light detecting device is provided. Its fabrication method, the functions of the respective members, the effects of the invention are the same as in the above-described embodiment (FIG. 19).

Conventionally expensive optical systems have been used for the prevention of occurrences of leakage light, but the improved photodiode chips 100 of the present invention allow inexpensive lenses to be used even with their imperfect condensation.

Because an optical fiber can be thus mounted on the semiconductor light detecting device in a short period of time which leads to lower costs, and no waveform distortions and noises occur in a number of applications, the semiconductor light detecting device according to the first embodiment of this invention accelerates at once wide applications of the optical communication which have been slow because of the expensiveness of the conventional semiconductor light detecting devices. In another embodiment of this invention (for example, the first embodiment), the semiconductor light detecting device may be applied to butterfly-type housings with a result of the same effects.

The installation of the photodiode chip of a structure having a region for capturing unnecessary reactive carriers as the photodiode chip, which is the light detecting means produces the following effects.

In the first embodiment, even in radiating the signal light from an optical fiber to the light detecting surface of the photodiode chip without an optical lens system disposed therebetween, there is no occurrence of the signal waveform distortions (no slow response speed component of a photocurrent is generated). Furthermore an inexpensive semiconductor light detecting device without an expensive lens can be fabricated, and at the same time a semiconductor light detecting device which have successfully solved the conventional problems that the reproduced (photoelectrically converted) signals of analog signal light have phase shifts and high distortion levels, and digital signals have distortions in the signal waveforms unsuitably for the high-speed communication.

In the second embodiment, even in applying the signal light emitted from the end surface of an optical fiber to the light detecting surface of the photodiode chip with an inexpensive spherical lens disposed therebetween, no signal waveform distortion take place (no slow response speed component of a photocurrent is generated). Thus an inexpensive semiconductor light detecting device using no expensive lenses can be provided, successfully solving the problems that reproduced (photoelectrically converted) signals of analog signal light having phase shifts and high distortion levels, and signal waveforms of digital signals having distortions which are unsuitable for high-speed communication.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor light detecting device comprising:
    a housing having an optical fiber as an optical transmission path inserted therein;
    a header secured to said housing and integral therewith; and
    a photodiode chip mounted on said header, said photodiode chip including
    a compound semiconductor substrate,
    a cathode electrode provided on a first surface of said compound semiconductor substrate,
    a compound semiconductor layer of a first conductivity type provided on a second surface of said compound semiconductor substrate, said second surface being opposite to said first surface,
    a first region of a second conductivity type provided in said compound semiconductor layer, a pn junction area being formed at an interface of said compound semiconductor layer and said first region, said pn junction functioning as a photosensing region,
    a second region of said second conductivity type surrounding said first region and being spaced from said first region, said second region absorbing carriers generated near said second region in response to incident light, and
    an anode electrode provided on said first region and electrically connected thereto.

2. A semiconductor light detecting device according to claim 1, wherein
    said compound semiconductor layer is made by crystal growth of a semiconductor material having a composition which is the same as that of said compound semiconductor substrate.

3. A semiconductor light detecting device according to claim 1, wherein
    said compound semiconductor layer is a lamination of a plurality of semiconductor layers having lower impurity concentrations than that of said compound semiconductor substrate, and at least one of said plurality of semiconductor layers, which does not contact said compound semiconductor substrate, has a composition which is different from said compound semiconductor substrate.

4. A semiconductor light detecting device according to claim 3, wherein
    said compound semiconductor substrate is an $n^+$-type InP (indium-phosphide) substrate, and said compound semiconductor layer is a lamination of an n-type InP buffer layer, an n-type InGaAs (indium-gallium-arsenide) absorbing layer and an n-type InP window layer, in sequence.

5. A semiconductor light detecting device according to claim 1, wherein said first region of said photodiode chip includes a main surface which is opposite said interface, and wherein
    said optical fiber and said photodiode chip are optically coupled without contacting each other; and a signal light emitting end surface of said optical fiber and said main surface of said photodiode chip are opposed to each other.

6. A semiconductor light detecting device comprising:
    a housing with an optical fiber as an optical transmission path inserted therein;
    a header secured to said housing and integral therewith; and
    a photodiode chip mounted on said header, said photodiode chip including
    a compound semiconductor substrate of a highly doped first conductivity type,
    a low doped compound semiconductor layer provided on a front surface of said compound semiconductor substrate,
    a first region of a highly doped second conductivity type provided in said low doped semiconductor layer, a pn junction functioning as a photo-sensing region being formed at an interface of said first region and said low doped semiconductor layer, a second region of said second conductivity type surrounding said first region and being spaced from said first region, and a cathode electrode provided on a back surface of said compound semiconductor substrate.

7. A semiconductor light detecting device according to claim 6, wherein said first region of said photodiode chip includes a main surface which is opposite said interface, and wherein said optical fiber and said photodiode chip are optically coupled with each other; and a signal light emitting end surface of said optical fiber and said main surface of said photodiode chip are opposed to each other.

8. A semiconductor light detecting device according to claim 1, further comprising:

an optical lens system provided within a housing which transmits signal light emitted from an end surface of said optical fiber to said first region of said photodiode chip.

9. A semiconductor light detecting device according to claim 8, wherein said compound semiconductor layer is made by crystal growth of a semiconductor material having a composition which is the same as that of said compound semiconductor substrate.

10. A semiconductor light detecting device according to claim 8, wherein said compound semiconductor layer is a lamination of a plurality of semiconductor layers having lower impurity concentrations than that of said compound semiconductor substrate, and at least one of said plurality of semiconductor layers, which does not contact said compound semiconductor substrate, has a composition which is different from that of said compound semiconductor substrate.

11. A semiconductor light detecting device according to claim 10, wherein said compound semiconductor substrate is an $n^+$-type InP (indium-phosphide) substrate, and said compound semiconductor layer is a lamination of an n-type InP buffer layer, an n-type InGaAs (indium-gallium-arsenide) absorbing layer and an n-type InP window layer, in sequence.

12. A semiconductor light detecting device according to claim 8, wherein said first region of said photodiode chip includes a main surface which is opposite said interface, and wherein said optical fiber and said photodiode chip are optically coupled with each other through said optical lens system; and said signal light emitting end surface of said optical fiber and said main surface of said photodiode chip are opposed to each other.

13. A semiconductor light detecting device according to claim 8, wherein said photodiode chip mounted on said header is airtightly sealed within a cap, and the interior of said cap is filled with an inert element.

14. A semiconductor light detecting device according to claim 13, wherein said cap has a light transmitting window for passing signal light emitted from the light emitting end surface of said optical fiber.

15. A semiconductor light detecting device according to claim 12, wherein said optical lens system uses a spherical lens.

16. A semiconductor light detecting device according to claim 15, wherein said spherical lens is secured to a lens holder which is integrated with said housing.

17. A semiconductor light detecting device according to claim 15, wherein said spherical lens is secured to a cap, which cap airtightly seals said photodiode chip mounted on said header.

18. A semiconductor light detecting device according to claim 17, wherein said spherical lens is secured at a position on said cap so as to act as a light transmitting window.

19. A semiconductor light detecting device according to claim 6, further comprising:

an optical lens system provided within a housing which transmits signal light emitted from an end surface of said optical fiber to said first region of said photodiode chip.

20. A semiconductor light detecting device according to claim 19, wherein said first region of said photodiode chip includes a main surface which is opposite said interface, and wherein said optical fiber and said photodiode chip are optically coupled with each other through said optical lens system; and said signal light emitting end surface of said optical fiber and said main surface of said photodiode chip are opposed to each other.

21. A semiconductor light detecting device according to claim 19, wherein said photodiode chip mounted on said header is airtightly sealed within a cap, and an interior of said cap is filled with an inert element.

22. A semiconductor light detecting device according to claim 21, wherein said cap has a light transmitting window for passing signal light emitted from said light emitting end surface of said optical fiber.

23. A semiconductor light detecting device according to claim 20, wherein said optical lens system uses a spherical lens.

24. A semiconductor light detecting device according to claim 23, wherein said spherical lens is secured to a lens holder which is integrated with said housing.

25. A semiconductor light detecting device according to claim 23, wherein said spherical lens is secured to a cap, which cap airtightly seals said photodiode chip mounted on said header.

26. A semiconductor light detecting device according to claim 25, wherein said spherical lens is secured at a position on said cap so as to act as a light transmitting window.

* * * * *